United States Patent
McDonough et al.

[19]

[11] Patent Number: 5,945,835
[45] Date of Patent: *Aug. 31, 1999

[54] RADIO FREQUENCY TEST PROBE WITH INTEGRAL MOUNT FOR CIRCUIT BOARD UNDER TEST

[75] Inventors: Paul R. McDonough, Marlboro; Dennis A. Oleary, Red Bank, both of N.J.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/811,993

[22] Filed: Mar. 5, 1997

[51] Int. Cl.[6] ................................................. G01R 31/02

[52] U.S. Cl. .................................. 324/754; 324/158.1

[58] Field of Search ......................... 324/754, 158.1

[56] References Cited

U.S. PATENT DOCUMENTS

| 4,138,643 | 2/1979 | Beck et al. | 324/754 |
|---|---|---|---|
| 4,365,195 | 12/1982 | Stegens | 324/754 |
| 4,697,143 | 9/1987 | Lockwood et al. | 324/754 |
| 4,894,612 | 1/1990 | Drake et al. | 324/754 |
| 5,198,754 | 3/1993 | Binet | 324/158.1 |
| 5,311,122 | 5/1994 | Fullerton et al. | 324/158.1 |

*Primary Examiner*—Josie Ballato
*Assistant Examiner*—Russell M. Kobert

[57] ABSTRACT

A radio frequency (RF) test probe arrangement includes a test probe body with a probe for coupling with a RF port of a circuit to be tested, wherein the port has a RF terminal and a ground conductor in the vicinity of the RF terminal to define an operating impedance at the RF port. The probe includes an RF contact supported by the probe body for electrically contacting the RF terminal of the RF port of the circuit to be tested, and a ground contact fixed on the probe body in the vicinity of the RF contact, for electrically contacting the ground conductor at the RF port. A connector mounted on the probe body couples the probe with external test measurement instrumentation.

8 Claims, 3 Drawing Sheets

DUT RF INPUT/OUTPUT ENGAGING RF TEST PROBE

DUT COPLANAR RF GROUND PLANE ENGAGING RF TEST PROBE COPLANAR GROUND CONTACTS

S11 INTO OPEN

S11 INTO SHORT

START 800.000 000 MHz    STOP 900.000 000 MHz

RADIO FREQUENCY TEST PROBE WITH INTEGRAL MOUNT FOR CIRCUIT BOARD UNDER TEST

BACKGROUND OF THE INVENTION

1. Field of the Invention

The present invention relates to radio frequency (RF) test probes, and particularly to a test probe arrangement that facilitates repeatable and accurate test measurements of RF circuit boards in automated production testing.

2. Discussion of the Known Art

To perform reliable operating tests on wireless products during production runs, accurate RF measurement instrumentation must be interfaced with each production unit quickly and in a way that ensures proper matching between the instrumentation and each unit to be tested. False test readings due to a bad connection between the measurement instrumentation and the production units can lower production efficiency, if a unit that would perform properly in the field tests erroneously as a "fail". Moreover, customer dissatisfaction will result when a unit that is really out of spec but measures falsely under test as a "pass", is allowed to be sold.

Present cellular and PCS telephone handsets operate in frequency ranges from around 800 MHZ to above 1900 MHZ, and test procedures at these frequencies must be performed with due care. For example, RF and ground contacts between the test instrumentation and the units under test must not act to cause mismatches or significant RF power losses.

One known technique for testing the performance of a hand-held cellular wireless unit includes connecting a length of small-diameter "mini" coaxial cable at one end to an antenna port of the unit, and the other end of the cable is fixed with other test leads to a multi-pin test connector mounted on the unit. This arrangement has certain disadvantages. For example, the length of "mini" cable acts to de-tune or load down the antenna port, and thus compromise the operating parameters established for the unit. Also, the cable does not present a matched load at the antenna port so that inaccurate test measurements can result.

Another known procedure calls for testing a RF circuit board by positioning it on a number of spring-loaded contact pins. A number of the pins contact ground conductors at various locations on the board, and these pins are connected in common to the body of a coaxial connector. A different pin contacts a board RF terminal and the board is pressed on the contact pins. The RF contact pin is connected to a center pin of the coaxial connector, and a test measurement instrument is connected by a cable to the connector. The arrangement fails to work properly at cellular and PCS radio frequencies, because (1) the spring loaded pins have lengths that look inductive to RF currents through them, (2) the multiple ground contacts with the circuit board cause undesirable RF loop currents, and (3) the impedance at the RF test point on the circuit board and that of the test instrument are not properly matched with one another.

A need therefore exists for a RF test probe arrangement for production RF equipment, which arrangement allows the equipment to be tested repeatedly and accurately for its performance when fully assembled and used in the field by consumers. Ideally, the probe arrangement should enable repeatable measurements of high volume production RF equipment at the circuit board level, and consistent with the actual performance of the equipment when fully assembled. At a minimum, the arrangement should allow test measurements of signal-in-noise-and-distortion to noise-and-distortion (SINAD) for analog units, and of bit-error rate (BER) for digital RF equipment; and it should not be susceptible to wear or require significant maintenance.

SUMMARY OF THE INVENTION

According to the invention, a radio frequency (RF) test probe arrangement comprises an electrically conductive test probe body, and probe means for coupling with a RF port of a circuit to be tested, wherein the RF port has a RF terminal and a ground conductor in the vicinity of the RF terminal to define an operating impedance at the RF port. The probe means includes RF contact means supported by the probe body for electrically contacting the RF terminal at said RF port, and ground contact means fixed on the probe body in the vicinity of the RF contact means for electrically contacting the ground conductor at the RF port. Connection means mounted on the probe body is adapted to couple the probe means with external test measurement instrumentation.

For a better understanding of the invention, reference is made to the following description taken in conjunction with the accompanying drawing, and the scope of the invention will be pointed out by the appended claims.

DETAILED DESCRIPTION OF THE INVENTION

Figure 1:
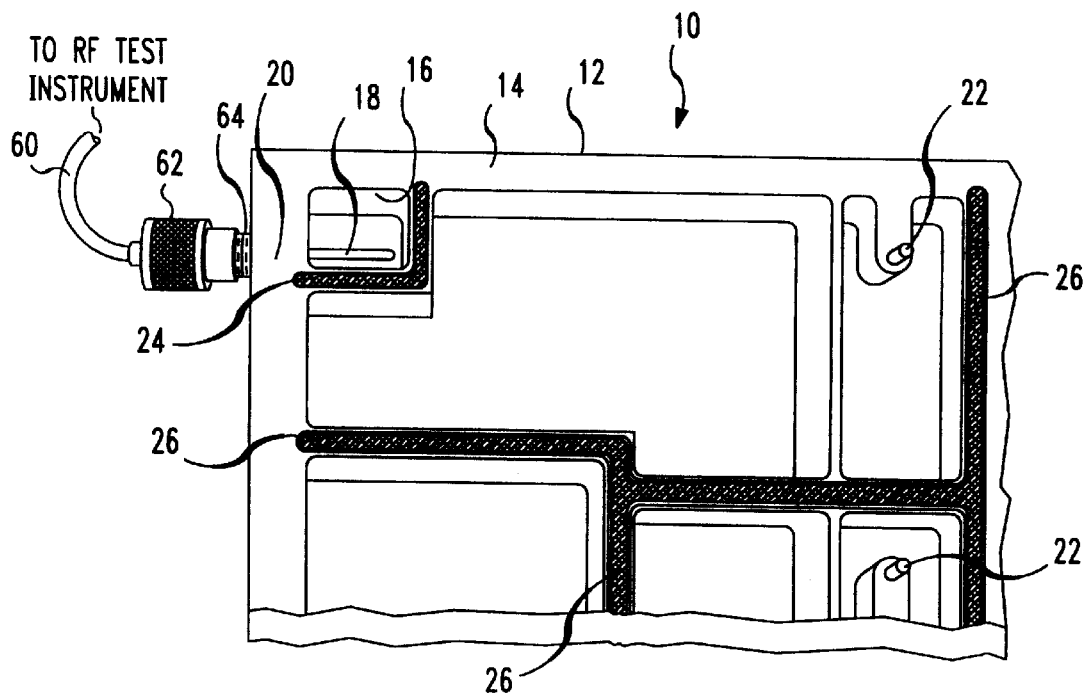
FIG. 1 is a perspective view of a first embodiment of a RF test probe according to the invention, showing RF and ground contacts of the probe.

FIG. 1 is a view of a first preferred embodiment of a RF test probe 10, according to the invention. The probe 10 has a probe body 12 in the form of a block of an electrically conductive material such as, for example, aluminum. An upper surface 14 of the probe body has recessed areas to allow clearance for components mounted on a circuit board (see FIGS. 2 and 3) while the circuit board is being tested with the probe.

A generally rectangular recess 16 in the probe body surface 14 contains a rigid, elongate probe RF contact 18 which extends through a left outer wall 20 of the probe body as viewed in FIG. 1. The probe RF contact 18 is insulated from contact with the probe body wall 20 by a surrounding dielectric material, and the contact 18 is exposed inside the recess 16. Preferably, the characteristic impedance between the probe RF contact 18 and the probe body 12, closely matches that of a RF port through which measurements are made via the probe 10 on a circuit to be tested. As is known in the art, proper impedance matching will avoid any significant loss or distortion of RF signals passing through the tested circuit's RF port during the test procedure. The probe body wall surrounding the recess 16 also serves to shield the RF port of the circuit under test, thus ensuring that measurements made via the probe 10 will not be subject to ambient RF noise.

A set of guide pins 22, two of which are shown in FIG. 1, project from the upper surface 14 of the probe body 12 to engage corresponding guide pin openings in a circuit board to be tested by the probe 10. See FIG. 2. The guide pins 22 act to seat the circuit board so that a RF port to which the probe is to be coupled, will be in alignment with the probe body recess 16.

A probe ground contact 24 is fixed on the probe body 12, in the vicinity of the probe RF contact 18 as shown in FIG. 1. The ground contact 24 is preferably formed by a resilient metallic material (e.g., copper braid) embedded in and slightly raised from the upper surface 14 of the probe body near the edge of the recess 16. The ground contact 24 is positioned to make positive contact with a ground conductor at the RF port of the circuit under test. Other ground contacts 26 may also be fixed on non-recessed portions of the probe body surface 14, for contacting other grounded areas of the circuit to be tested.

Figure 2:
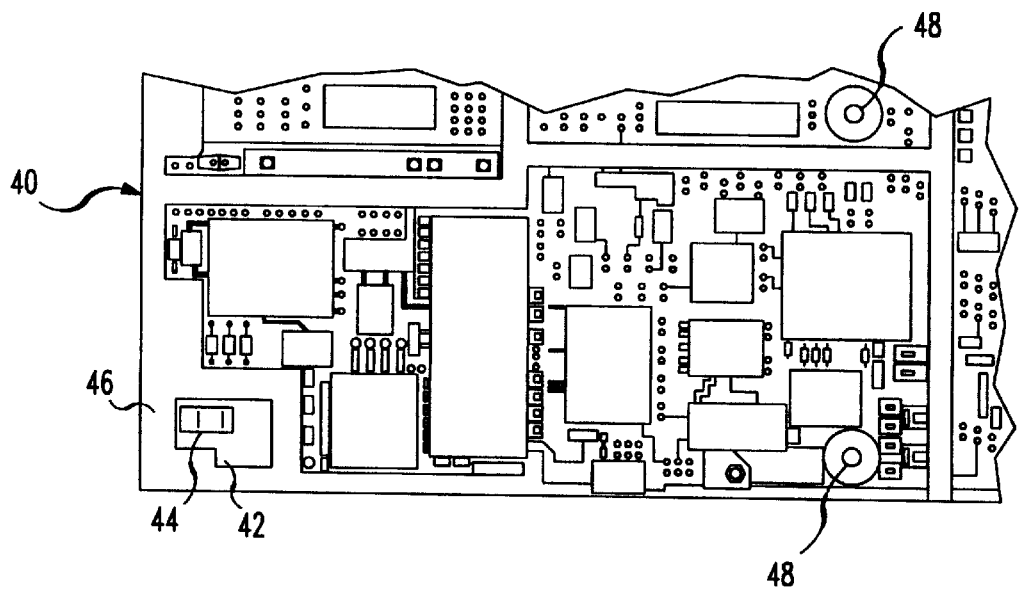
FIG. 2 is a plan view of part of a circuit board to be tested by the probe of FIG. 1, including a RF port on the board.
Figure 3:
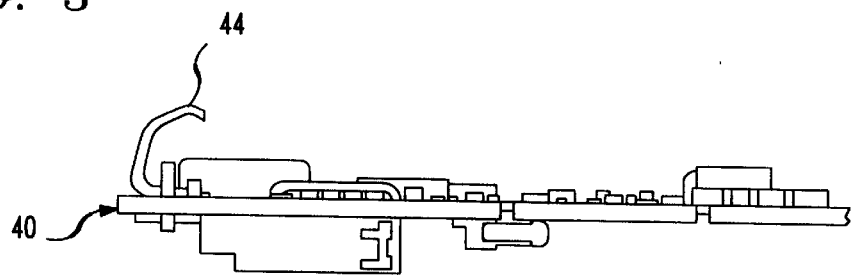
FIG. 3 is a side edge view of the circuit board of FIG. 2.

FIG. 2 is a plan view of part of a RF circuit board 40. FIG. 3 is a side edge view of the circuit board 40 in FIG. 2. For example, circuit board 40 may support both digital and analog signal processing circuits in the form of integrated circuit (IC) chips for handling base band (e.g., speech or data) signals, and for modulating the base band signals on a synthesized RF carrier signal. Modulated RF carrier signals are transmitted and received through an RF port 42 on the board 40. When assembled in a hand set, the RF port 42 is coupled to an antenna (not shown) which is resonant at the operating radio frequencies of the assembled hand set. RF port 42 includes a RF terminal 44 in the form of, for example, a spring finger contact made from gold plated beryllium-copper. A base of the RF terminal 44 is mounted on the circuit board 40 and connects with an electronic transmit-receive switch or equivalent circuit.

RF port 42 is also defined by a co-planar ground conductor 46 on the circuit board 40 in the vicinity of the RF terminal 44. Ground conductor 46 is part of a ground plane which, together with the RF terminal 44, defines an operating impedance at the RF port 42.

A set of guide pin openings 48 are formed in the circuit board 40 (see FIG. 2) at determined locations, to receive the guide pins 22 on the probe body 12 in FIG. 1 when the board 40 is turned upside-down from its position in FIG. 2 and placed on the probe body 12. When the board 40 is placed on the probe body 12, the board's RF terminal 44 enters the probe body recess 16 to contact the probe RF contact 18. Also, the planar ground conductor 46 on the board 40 abuts the ground contact 24 of the probe 10, along the edge of the recess 16 and near the RF contact 18.

IC chips and other components mounted on the board 40 on the same side as the RF terminal 44, are accommodated by the other recesses in the probe body surface 14 with enough clearance to avoid damage. Preferably, means (not shown) are provided for urging the circuit board 40 against the probe body surface 14 to ensure positive contacts, particularly in the region of the RF port 44 on the board when placed over the recess 16 in the probe body surface.

When using the probe 10, a RF test measurement instrument is coupled to the probe through, for example, a coaxial cable 60 as shown in FIG. 1. A cable connector 62 engages a mating connector 64 which is mounted on the side of the probe body 12. Connector 64 serves to connect a center conductor of the cable 60 to the probe RF contact 18, and to connect a ground shield of the cable 60 to the probe body 12 including the body ground contact 24. The operating impedances of the RF measurement instrument, the coaxial cable 60, connectors 62, 64, and the RF contact 18 with respect to the probe body 12, are preferably matched to one another. The operating impedance of the RF port 42, 44 on the circuit board 40 is matched to the antenna port impedance. By contacting the ground plane 46 of the circuit board and the ground contact 24 of the coaxial connector 60, 62, 64 with the probe body 12, a continuous common reference to ground is made. By ensuring this common ground plane continuity between both the RF circuit board and the RF test probe, RF measurements can be made reliable and repeated consistently.

Figure 4:
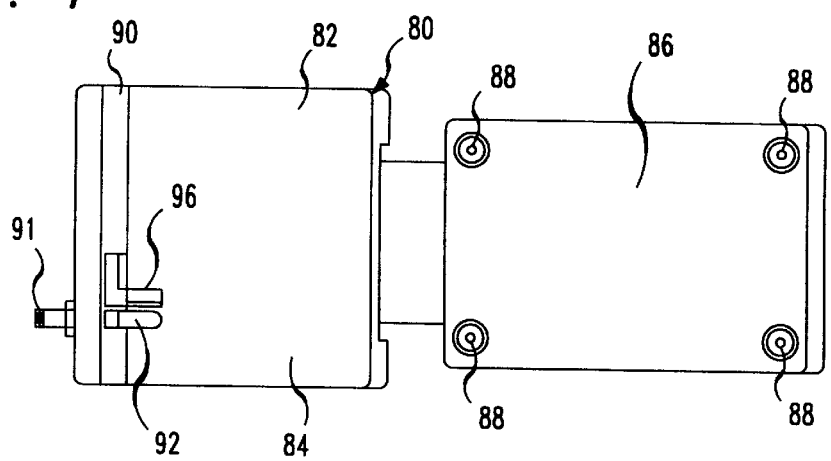
FIG. 4 is a perspective view of a second embodiment of a RF test probe according to the invention, showing RF and ground contacts of the probe.
Figure 5:
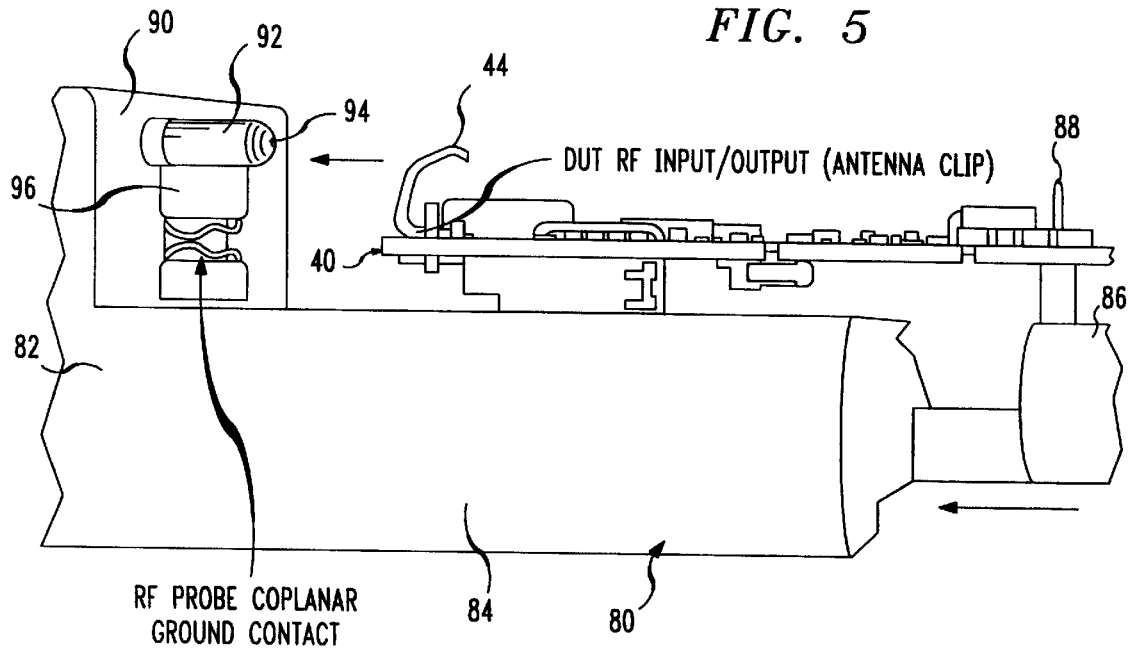
FIG. 5 is an enlarged, side view of the test probe of FIG. 4, showing a circuit board being guided to connect with RF and ground contacts of the probe.
Figure 6:
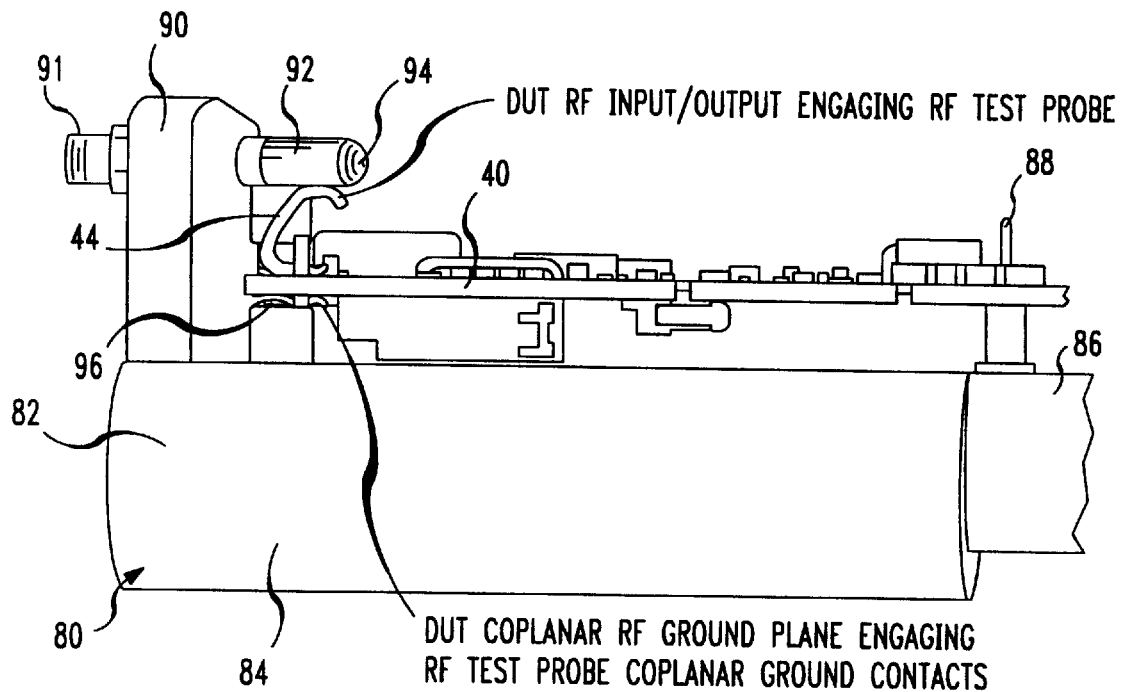
FIG. 6 is a side view of the probe as in FIG. 5, showing a RF port on the circuit board connected with the probe contacts.

FIG. 4 is a view of a second embodiment of a RF test probe 80 according to the invention. FIGS. 5 and 6 are side views of the test probe of FIG. 4, showing the circuit board 40 to be tested mounted on the test probe 80 just prior to and during a test procedure.

The test probe 80 has a probe body 82 comprising a probe contact measurement body part 84 and a circuit board mounting body part 86. The two body parts 84, 86 are constructed and arranged to slide relative to one another between a board mounting position at which a circuit board can be mounted or dismounted from the mounting body part 86 (FIGS. 4 and 5), and a measurement position at which the mounted circuit board can be tested via the probe 80 (FIG. 6). The mounting body part 86 has a set of guide pins 88 for engaging the guide pin openings 48 in the circuit board 40. See FIGS. 5 and 6.

The measurement body part 84 of the probe 80 has a vertical wall at its left end as viewed in the drawing, and a conventional coaxial female connector 91 (e.g., OSM type 2052-1352-00) is mounted on the wall 90. The center pin of the connector 91 and its surrounding dielectric insulation extend through a bore in the wall 90, and a RF contact 92 in the form of a cylindrical probe tip is joined axially over the free end of the connector center pin. The RF contact 92 has a rounded tip end 94, and may be formed, e.g., from a conductive rod having an axial opening drilled to provide a tight fit on the center pin of the connector 91.

A probe ground contact 96 is provided in the form of a generally flat spring clip. Contact 96 is made, for example, from a resilient piece of sheet metal such as gold plated beryllium copper. Preferably, the ground contact 96 is fixed on the measurement body part wall 90 in the vicinity of the RF contact 92, by a fastener member which is also used to mount a flange of the connector 91. An engaging part of the ground contact 96 is configured to contact firmly on the planar ground conductor 46 on circuit board 40, when the board 40 is mounted on the probe 80 and advanced toward the probe wall 90.

As shown in the measurement position in FIG. 6, after striking the tip end 94, the board RF terminal 44 is aligned flush and in electrical contact with the periphery of the RF contact 92. As in the case of the test probe 10 in FIG. 1, repeatable and accurate RF test measurements can be made on production circuit boards when a measurement instrument is connected to the test probe connector 91, and the boards are guided individually by the probe 80 to the position in FIG. 6.

Figure 7:
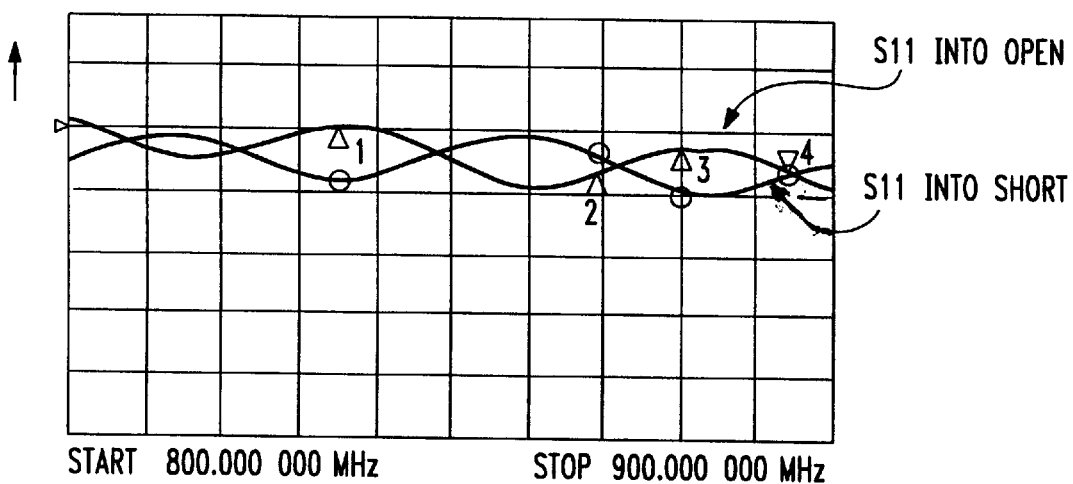
FIG. 7 is a graph illustrating signal transmission and reflection characteristics of a RF test connector on the probe of FIG. 4.

FIG. 7 is a graph showing typical measured reflection coefficients for the connector 91 on the probe 80 in FIG. 4. Graph points shown with triangles correspond to measurements calculated under open circuit conditions, and points marked with circles correspond to measurements calculated under short circuit conditions. In tests conducted in the range of 835 MHZ to 894 MHZ, an insertion loss of about 1.1 dB was determined. As will be understood by those skilled in the art, the insertion loss of any connector on the probe 80 (or 10) must be accounted for when making production test measurements on circuits with the present RF probe arrangement.

Typical test measurements that can be carried out on production circuit boards with the present RF probe arrangement include, without limitation, RF output power calibration, SINAD for analog cellular service including FDMA, and bit error rate (BER) and error vector magnitude (EVM) for digital applications including TDMA, CDMA and PCS environments. The present probe arrangement provides an interface by which all important high frequency RF test measurements can be made on production circuit boards prior to final assembly.

While the foregoing description represents preferred embodiments of the invention, it will be obvious to those skilled in the art that various changes and modifications may be made, without departing from the true spirit and the scope of the invention which is pointed out by the following claims.

What we claim is:

1. A radio frequency (RF) test probe arrangement for a circuit board having a RF port, comprising:
   a test probe body formed of a block of electrically conductive material having an upper surface with at least one recess, the test probe body having
   a probe contact portion configured for coupling with the RF port of the circuit board to be tested, wherein said port has a RF terminal and a ground conductor in the vicinity of the RF terminal to define an operating impedance at the RF port of the circuit board;
   said probe contact portion including a probe RF contact exposed inside the recess in the test probe body, and said probe RF contact is dimensioned and arranged for electrically contacting the RF terminal of the RF port of the circuit board to be tested, and a probe ground contact fixed on the upper surface of the test probe body in the vicinity of the recess, the ground contact being dimensioned and arranged for electrically contacting the ground conductor at the RF port of the circuit board to be tested;
   a circuit board mounting portion having guide parts located to engage the circuit board to be tested and to position the circuit board so that its RF port is operatively aligned with the probe contact portion of the test probe body;
   said guide parts including pin members constructed and arranged to project from the upper surface of the test probe body to allow corresponding portions of the circuit board to engage the pin members, and wherein the pin members guide the circuit board so that the RF terminal of its RF port enters the recess in the test probe body to contact said probe RF contact, and the ground conductor of the RF port engages said probe ground contact in the vicinity of the recess; and
   a connector mounted on the test probe body for coupling the circuit board with external test measurement instrumentation.

2. A RF test probe arrangement according to claim 1, wherein the probe ground contact of the probe contact portion comprises a resilient metallic material fixed on said block in the vicinity of the probe RF contact.

3. A RF test probe arrangement according to claim 1, wherein said connector is a coaxial connector.

4. A RF test probe arrangement according to claim 3, wherein the coaxial connector has a center pin, and the center pin is joined to the probe RF contact of the probe contact portion.

5. A RF test probe arrangement according to claim 3, wherein a mounting part of the coaxial connector is in electrical conducting relation with the probe ground contact of the probe contact portion.

6. A RF test probe arrangement for a circuit board having a RF port, comprising:
   a probe contact portion configured for coupling with the RF port of the circuit board to be tested, wherein said port has a RF terminal and a ground conductor in the vicinity of the RF terminal to define an operating impedance at the RF port of the circuit board;
   said probe contact portion including a probe RF contact located and arranged for electrically contacting the RF terminal of the RF port of the circuit board to be tested, and a probe ground contact fixed in the vicinity of the probe RF contact for electrically contacting the around conductor at the RF port of the circuit board to be tested; and
   a circuit board mounting portion having guide parts located to engage the circuit board to be tested and to position the circuit board so that its RF port is operatively aligned with the probe contact portion of the test probe body;
   wherein the circuit board mounting portion is constructed and arranged to slide relative to the probe contact portion between a board mounting position at which a circuit board can be mounted or dismounted from the circuit board mounting portion, and a measurement position at which the mounted circuit board can be tested via the probe contact portions;
   said guide parts including pin members constructed and arranged to project from the circuit board mounting portion to allow corresponding portions of the circuit board to engage the pin members, and wherein the pin members act to position the circuit board so that the RF terminal of its RF port engages said probe RF contact and the ground conductor of the RF port engages the probe ground contact, when the circuit board mounting portion is moved to the measurement position; and
   a connector mounted on said probe contact portion for coupling the circuit board with external test instrumentation.

7. A RF test probe arrangement according to claim 6, wherein the RF contact means of the probe means comprises a conductive rod member which is supported on said measurement body part.

8. A RF test probe arrangement according to claim 7, wherein the probe ground contact of the probe contact portion comprises a generally flat conductive spring clip that is fixed in the vicinity of the probe RF contact.

* * * * *